United States Patent
Laskaris et al.

[11] Patent Number: 5,883,558
[45] Date of Patent: Mar. 16, 1999

[54] OPEN SUPERCONDUCTIVE MAGNET HAVING SHIELDING

[75] Inventors: Evangelos Trifon Laskaris, Niskayuna; Michael Anthony Palmo, Ballston Spa, both of N.Y.; Bu-Xin Xu, Florence, S.C.

[73] Assignee: General Electric Company, Schenectady, N.Y.

[21] Appl. No.: 61,415

[22] Filed: Apr. 16, 1998

Related U.S. Application Data

[63] Continuation-in-part of Ser. No. 26,390, Feb. 19, 1998, Pat. No. 5,874,882, and a continuation-in-part of Ser. No. 35,639, Mar. 5, 1998, Pat. No. 5,874,880.

[51] Int. Cl.$^6$ ........................................................ H01F 1/00
[52] U.S. Cl. ............................ 335/216; 335/299; 335/318
[58] Field of Search ..................................... 335/216, 296, 335/297–301; 324/318, 319, 320, 321; 505/5

[56] References Cited

U.S. PATENT DOCUMENTS

| | | |
|---|---|---|
| 5,345,208 | 9/1994 | Dorri et al. . |
| 5,410,287 | 4/1995 | Laskaris et al. . |
| 5,436,607 | 7/1995 | Chari et al. . |
| 5,446,434 | 8/1995 | Dorri et al. . |
| 5,448,214 | 9/1995 | Laskaris . |
| 5,517,168 | 5/1996 | Dorri et al. . |
| 5,517,169 | 5/1996 | Laskaris et al. . |
| 5,565,831 | 10/1996 | Dorri et al. . |
| 5,568,102 | 10/1996 | Dorri et al. ............................ 335/216 |
| 5,568,104 | 10/1996 | Laskaris et al. ....................... 335/216 |
| 5,680,086 | 10/1997 | Allis et al. ............................. 335/296 |

*Primary Examiner*—Lincoln Donovan
*Attorney, Agent, or Firm*—Douglas E. Erickson; Marvin Snyder

[57] ABSTRACT

An open superconductive magnet useful in magnetic resonance imaging (MRI) applications. The magnet has two spaced-apart assemblies and preferably has a "C" shape. Each assembly has: a vacuum enclosure having a longitudinal axis and surrounding a bore; a magnetizable pole piece located within the bore and outside the vacuum enclosure; and a superconductive main coil, a superconductive shielding coil, and a magnetizable ring positioned within the vacuum enclosure. There is no magnetizable solid path between the two pole pieces. Preferably, the ring is positioned longitudinally between the main and shielding coils.

17 Claims, 4 Drawing Sheets

OPEN SUPERCONDUCTIVE MAGNET HAVING SHIELDING

CROSS-REFERENCE TO RELATED APPLICATIONS

The present patent application is a continuation-in-part application of U.S. patent application Ser. No. 09/026,390 by Evangelos T. Laskaris et al. which is entitled "Open and Shielded Superconductive Magnet" and which was filed Feb. 19, 1998 now U.S. Pat. No. 5,874,882 and of U.S. patent application Ser. No. 09/035,639 by Evangelos T. Laskaris et al. which is entitled "Shielded and Open Superconductive Magnet" and which was filed Mar. 5, 1998, now U.S. Pat. No. 5,874,880.

FIELD OF THE INVENTION

The present invention relates generally to an open superconductive magnet used to generate a uniform magnetic field, and more particularly to such a magnet having shielding to protect the area around the magnet from stray magnetic fields originating from the magnet.

BACKGROUND OF THE INVENTION

Superconductive magnets include those superconductive magnets which are part of a magnetic resonance imaging (MRI) system used in various applications such as medical diagnostics. Known superconductive magnets include liquid-helium-cooled and cryocooler-cooled superconductive magnets. Typically, the superconductive coil assembly includes a superconductive main coil surrounded by a first thermal shield surrounded by a vacuum enclosure. A cryocooler-cooled magnet preferably also includes a cryocooler coldhead externally mounted to the vacuum enclosure, having its first cold stage in thermal contact with the thermal shield, and having its second cold stage in thermal contact with the superconductive main coil. A liquid-helium-cooled magnet preferably also includes a liquid-helium vessel surrounding the superconductive main coil and a second thermal shield which surrounds the first thermal shield which surrounds the liquid-helium vessel.

Known superconductive magnet designs include closed magnets and open magnets. Closed magnets typically have a single, tubular-shaped superconductive coil assembly having a bore. The superconductive coil assembly includes several radially-aligned and longitudinally spaced-apart superconductive main coils each carrying a large, identical electric current in the same direction. The superconductive main coils are thus designed to create a magnetic field of high uniformity within a typically spherical imaging volume centered within the magnet's bore where the object to be imaged is placed. A single, tubular-shaped superconductive shielding assembly may also be used to prevent the high magnetic field created by and surrounding the main coils from adversely interacting with electronic equipment in the vicinity of the magnet. Such shielding assembly includes several radially-aligned and longitudinally spaced-apart superconductive shielding coils carrying electric currents of generally equal amperage, but in an opposite direction, to the electric current carried in the main coils and positioned radially outward of the main coils.

Open magnets, including "C" shape magnets, typically employ two spaced-apart superconductive coil assemblies with the space between the assemblies containing the imaging volume and allowing for access by medical personnel for surgery or other medical procedures during magnetic resonance imaging. The patient may be positioned in that space or also in the bore of the toroidal-shaped coil assemblies. The open space helps the patient overcome any feelings of claustrophobia that may be experienced in a closed magnet design. Known open superconductive magnet designs having shielding include those wherein each superconductive coil assembly has an open bore and contains a superconductive shielding coil positioned longitudinally and radially outward from the superconductive main coil(s). A large amount of expensive superconductor is needed in the main coil to overcome the magnetic field subtracting effects of the shielding coil. Calculations show that for a 0.75 Tesla magnet, generally 2,300 pounds of superconductor are needed yielding an expensive magnet weighing generally 12,000 pounds. The modest weight makes this a viable magnet design.

It is also known in open magnet designs to place an iron pole piece in the bore of a superconductive coil assembly which lacks a superconductive shielding coil. The iron pole piece enhances the strength of the magnetic field and, by shaping the surface of the pole piece, magnetically shims the magnet improving the homogeneity of the magnetic field. An iron return path is used to connect the two iron pole pieces. It is noted that the iron pole piece also acts to shield the magnet. However, a large amount of iron is needed in the iron pole piece to achieve shielding in strong magnets. Calculations show that for a 0.75 Tesla magnet, only generally 200 pounds of superconductor are needed yielding a magnet weighing over 70,000 pounds which is too heavy to be used in medical facilities such as hospitals. The weight does not make this a viable magnet design.

What is needed is an open superconductive magnet design having shielding which is light enough to be used in medical facilities and which is less expensive than known designs.

SUMMARY OF THE INVENTION

The open superconductive magnet of the invention includes a first assembly and a second assembly. The first assembly includes a generally toroidal-shaped first vacuum enclosure, a generally annular-shaped first superconductive main coil, a generally annular-shaped first superconductive shielding coil, a magnetizable and generally annular-shaped first ring, and a magnetizable and generally cylindrical-shaped first pole piece. The first vacuum enclosure surrounds a first bore and has a generally longitudinally-extending first axis. The first superconductive main coil, the first superconductive shielding coil, and the first ring are generally coaxially aligned with the first axis and are located within the first vacuum enclosure. The first superconductive main coil carries a first main electric current in a first direction, and the first superconductive shielding coil carries a first shielding electric current in a direction opposite to the first direction. The first superconductive shielding coil is positioned longitudinally outward from the first superconductive main coil. The first ring is spaced apart from the first superconductive main and shielding coils. The first pole piece is generally coaxially aligned with the first axis and is located inside the first bore and outside the first vacuum enclosure.

The second assembly includes a generally toroidal-shaped second vacuum enclosure, a generally annular-shaped second superconductive main coil, a generally annular-shaped second superconductive shielding coil, a magnetizable and generally annular-shaped second ring, and a magnetizable and generally cylindrical-shaped second pole piece. The second vacuum enclosure surrounds a second bore and has a generally longitudinally-extending second axis which is generally coaxially aligned with the first axis. The second superconductive main coil, the second superconductive shielding coil, and the second ring are generally coaxially aligned with the second axis and are located within the second vacuum enclosure. The second superconductive main coil carries a first main electric current in the previously-defined first direction, and the second superconductive shielding coil carries a first shielding electric current in the previously-defined opposite direction. The second superconductive shielding coil is positioned longitudinally outward from the second superconductive main coil. The second ring is spaced apart from the second superconductive main and shielding coils. The second pole piece is generally coaxially aligned with the second axis and is located inside the second bore and outside the second vacuum enclosure. The second vacuum enclosure is longitudinally spaced apart from the first vacuum enclosure, and the second pole piece is longitudinally spaced apart from, and without a magnetizable solid path to, the first pole piece. The first and second superconductive main coils are longitudinally closer to each other than are the first and second superconductive shielding coils. In an exemplary construction, the first and second pole pieces consist essentially or iron, and the first and second rings consist essentially of carbon steel.

Several benefits and advantages are derived from the invention. The pole piece and the ring enhance the strength of the magnetic field so less superconductor is needed in the main coil. The carbon steel ring provides a partial magnetic flux return for the main coil which reduces the iron needed in the pole piece and which reduces the amount of superconductor needed in the main coil. The carbon steel ring also magnetically decouples the shielding coil from the main coil so that the magnetic flux lines from the shielding coil are captured by the iron ring and do not reach the magnetic flux lines from the main coil. Thus the iron mass of the pole piece does not have to be increased, and the amount of the superconductor in the main coil does not have to be increased, to offset the field subtracting effects of the magnetic flux lines from the shielding coil, since they are blocked by the presence of the carbon steel ring. Computer simulations show that a 0.7 Tesla magnet of the present invention would use generally 800 pounds of superconductor yielding a magnet weighing generally 16,000 pounds (which is light enough to be installed in a medical facility) and costing only half of what a viable equivalent conventional magnet would cost.

DETAILED DESCRIPTION OF THE INVENTION

Figure 1:
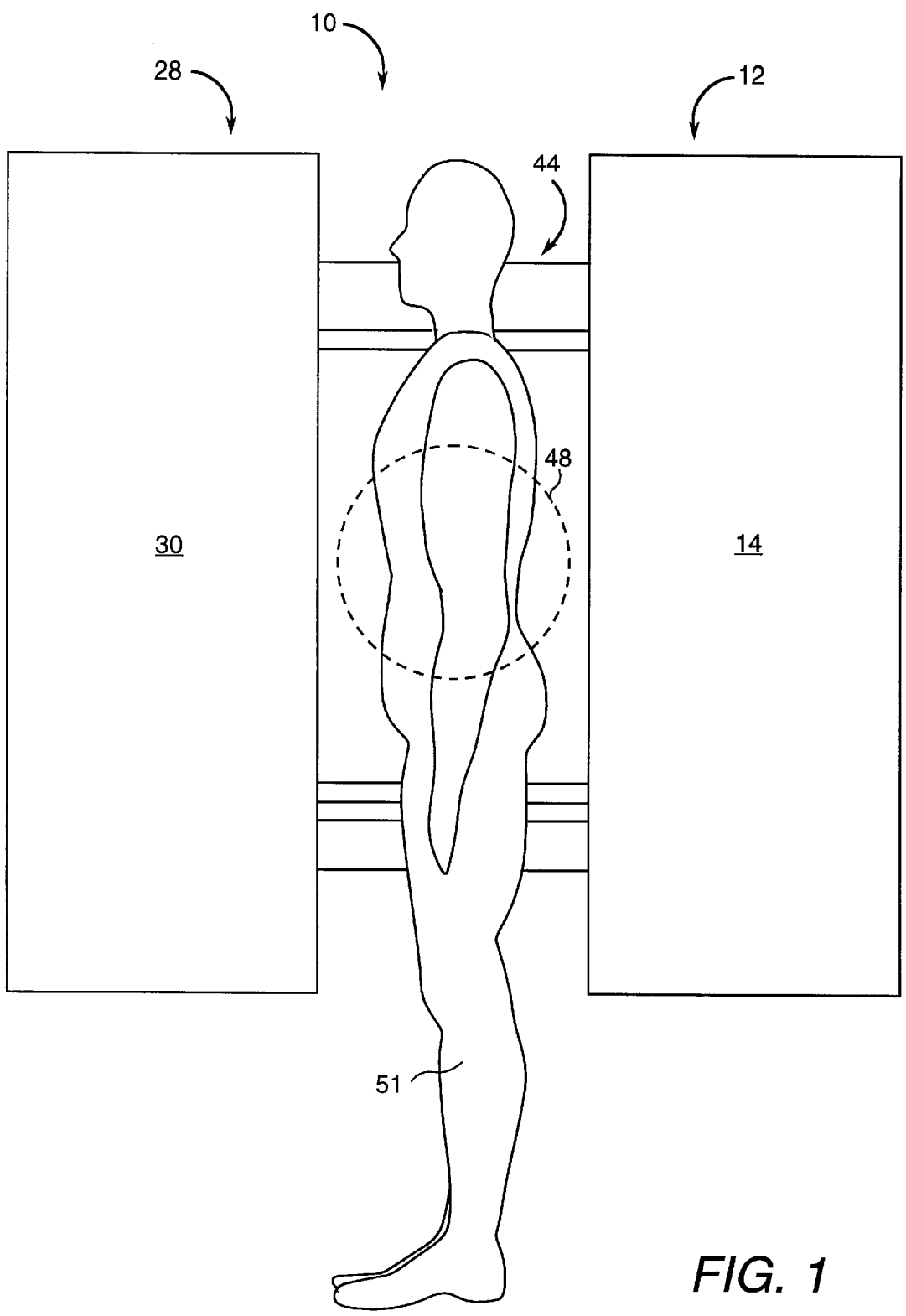
FIG. 1 is a schematic front elevational view of a first preferred embodiment of the open superconductive magnet of the invention.
Figure 2:
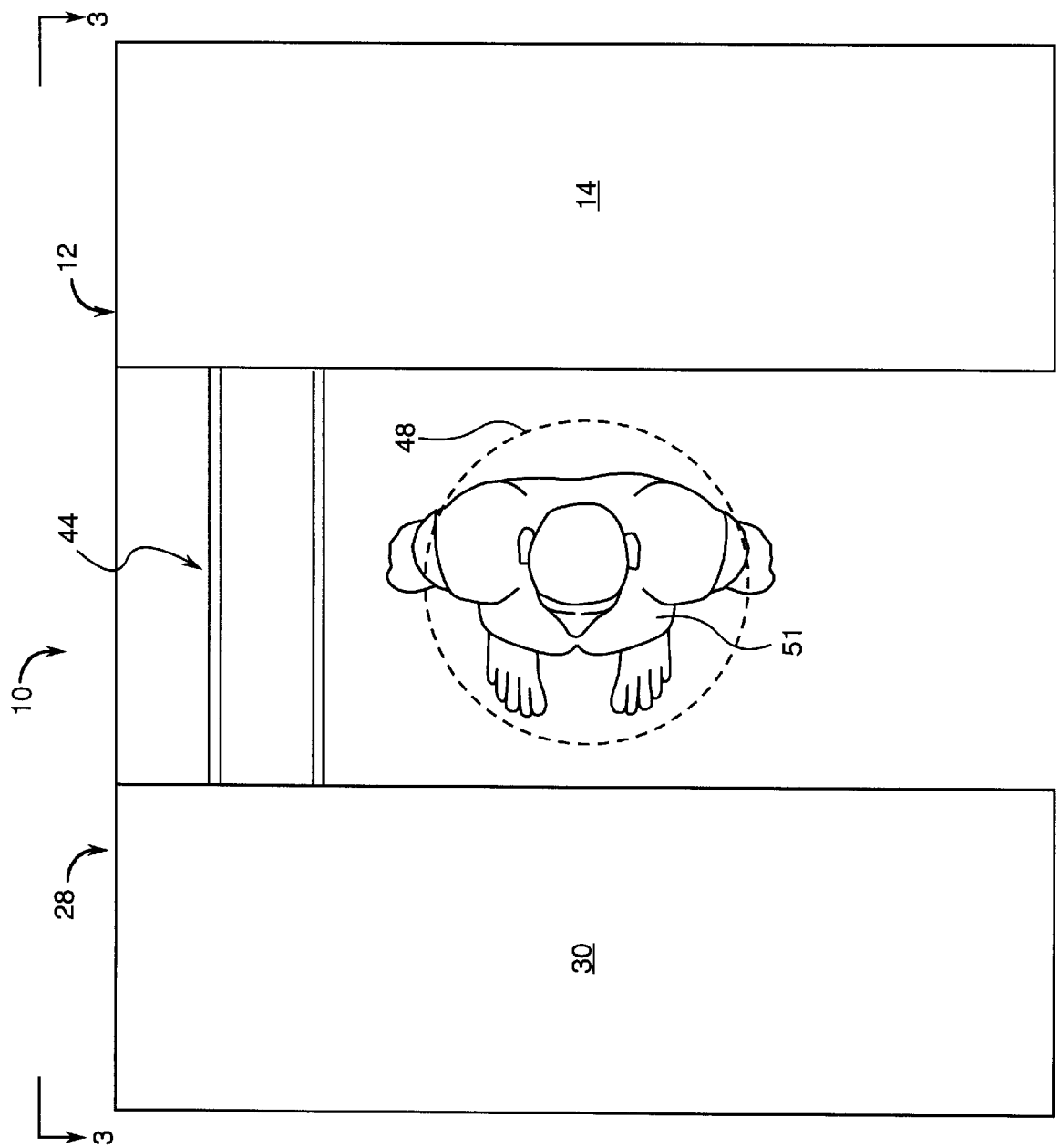
FIG. 2 is a schematic top planar view of the magnet of FIG. 1.

Referring now to the drawings, wherein like numerals represent like elements throughout, FIGS. 1–4 show a first preferred embodiment of the open superconductive magnet 10 of the present invention. Preferably, the magnet 10 is a 0.5 Tesla or higher magnet. The magnet 10 includes a first assembly 12. The first assembly 12 includes a generally toroidal-shaped first vacuum enclosure 14 surrounding a first bore 16 and having a generally longitudinally-extending first axis 18. Preferably, the first vacuum enclosure 14 consists essentially of nonmagnetic stainless steel or aluminum.

The first assembly 12 also includes a generally annular-shaped first superconductive main coil 20 generally coaxially aligned with the first axis 18 and disposed within the first vacuum enclosure 14. The first superconductive main coil 20 carries a first main electric current in a first direction. The first direction is defined to be either a clockwise or a counterclockwise circumferential direction about the first axis 18 with any slight longitudinal component of current direction being ignored. It is noted that additional first superconductive main coils may be needed to achieve a high magnetic field strength, within the magnet's imaging volume, without exceeding the critical current density of the superconductor being used in the superconductive coils, as is known to those skilled in the art. A preferred superconductor for the first superconductive main coil 20 is niobium-titanium.

The first assembly 12 additionally includes a generally annular-shaped first superconductive shielding coil 22 generally coaxially aligned with the first axis 18. The first superconductive shielding coil 22 is disposed within the first vacuum enclosure 14 longitudinally outward from the first superconductive main coil 20. The first superconductive shielding coil 22 carries a first shielding electric current in a direction opposite to the previously-defined first direction. A preferred superconductor for the first superconductive shielding coil 22 is niobium-titanium.

The first assembly 12 further includes a magnetizable and generally annular-shaped first ring 24 generally coaxially aligned with the first axis 18 and disposed within the first vacuum enclosure 14. The first ring 24 is spaced apart from the first superconductive main and shielding coils 20 and 22. Preferably the first ring 24 consists essentially of a ferromagnetic material. In a preferred construction, the first ring 24 consists essentially of carbon steel.

The first assembly 12 moreover includes a magnetizable and generally cylindrical-shaped first pole piece 26 generally coaxially aligned with the first axis 18. The first pole piece 26 is disposed inside the first bore 16 and outside the first vacuum enclosure 14. Preferably, the first pole piece 26 consists essentially of a ferromagnetic material. In a preferred construction, the first pole piece 26 consists essentially of iron. In an exemplary embodiment, the first pole piece 26 is attached to the first vacuum enclosure 14.

The open superconductive magnet 10 also includes a second assembly 28. The second assembly 28 includes a generally toroidal-shaped second vacuum enclosure 30 surrounding a second bore 32 and having a generally longitudinally-extending second axis 34 generally coaxially aligned with the first axis 18. The second vacuum enclosure 30 is longitudinally spaced apart from the first vacuum enclosure 14. Preferably, the second vacuum enclosure 30 consists essentially of nonmagnetic stainless steel or aluminum.

The second assembly 28 also includes a generally annular-shaped second superconductive main coil 36 generally coaxially aligned with the second axis 34 and disposed within the second vacuum enclosure 30. The second superconductive main coil 36 carries a second main electric current in the previously-defined first direction. It is noted that additional second superconductive main coils may be needed to balance any additional first superconductive main coils present in the first assembly, as is known to those skilled in the art. A preferred superconductor for the second superconductive main coil 36 is niobium-titanium.

The second assembly 28 additionally includes a generally annular-shaped second superconductive shielding coil 38 generally coaxially aligned with the second axis 34. The second superconductive shielding coil 38 is disposed within the second vacuum enclosure 30 longitudinally outward from the second superconductive main coil 36. The second superconductive shielding coil 38 carries a second shielding electric current in the previously-defined opposite direction. The first and second superconductive main coils 20 and 36 are longitudinally closer to each other than are the first and second superconductive shielding coils 22 and 38. A preferred superconductor for the second superconductive shielding coil 38 is niobium-titanium.

The second assembly 28 further includes a magnetizable and generally annular-shaped second ring 40 generally coaxially aligned with the second axis 34 and disposed within the second vacuum enclosure 30. The second ring 40 is spaced apart from the second superconductive main and shielding coils 36 and 38. Preferably the second ring 40 consists essentially of a ferromagnetic material. In a preferred construction, the second ring 40 consists essentially of carbon steel.

The second assembly 28 moreover includes a magnetizable and generally cylindrical-shaped second pole piece 42 generally coaxially aligned with the second axis 34. The second pole piece 42 is disposed inside the second bore 32 and outside the second vacuum enclosure 30. The second pole piece 42 is longitudinally spaced apart from, and without a magnetizable solid path to, the first pole piece 26. Preferably, the second pole piece 42 consists essentially of a ferromagnetic material. In a preferred construction, the second pole piece 42 consists essentially of iron. In an exemplary embodiment, the second pole piece 42 is attached to the second vacuum enclosure 30.

In an exemplary construction, the open superconductive magnet 10 includes only one support member 44 connecting the first and second assemblies 12 and 28, and desirably connecting the first and second pole pieces 26 and 42 of the first and second assemblies 12 and 28. The support member 44 is a nonmagnetizable support member preferably consisting essentially of nonmagnetic stainless steel. The support member 44 is disposed longitudinally completely between the first and second pole pieces 26 and 42. Preferably, the support member 44 and the first and second assemblies 12 and 28 together have a generally "C" shape when viewed in a cross section of the magnet 10 created by a cutting plane, wherein the first axis 18 lies completely in the cutting plane, and wherein the cutting plane generally bisects the support member 44. It is noted that the previously-defined cross section is the cross section shown in FIG. 3, with the "C" shape seen by rotating FIG. 3 ninety degrees counterclockwise.

Preferably, the second assembly 28 is a general mirror image of the first assembly 12 about a plane 46 (seen on edge as a dashed line in FIG. 3) disposed longitudinally equidistant between the first and second assemblies 12 and 28 and oriented generally perpendicular to the first axis 18. When the magnet 10 is employed as an MRI (magnetic resonance imaging) magnet, the magnet 10 includes a magnetic resonance imaging volume 48 (seen as a dotted line in FIGS. 1–3) disposed generally longitudinally equidistant between the first and second assemblies 12 and 28. It is preferred that the imaging volume 48 is a generally spherical imaging volume having a center 50 lying generally on the first axis 18. A patient 51 is shown in an imaging position in FIGS. 1 and 2.

It is noted that the superconductive coils 20, 22, 36, and 38 are cooled, to a temperature below their critical temperature to achieve and sustain superconductivity, preferably by liquid-helium (or other cryogenic) cooling, by cryocooler cooling, or by a combination thereof. It is also noted that the first and second rings 24 and 40 are cooled to the same cryogenic temperature as the superconductive coils 20, 22, 36, and 38. In a first cooling option (see FIG. 4), illustrated in the first assembly 12, the magnet 10 also includes a first cryogenic vessel 52 disposed within the first vacuum enclosure 14 and surrounding the first superconductive main and shielding coils 20 and 22 and the first ring 24. The first cryogenic vessel 52 contains a liquid cryogen 54, such as one consisting essentially of liquid helium. Preferably, the first cryogenic vessel 52 consists essentially of aluminum or nonmagnetic stainless steel.

In the first cooling option, preferably the first assembly 12 also includes a first thermal shield 56, an inner support cylinder 58, and an outer support cylinder 60 all disposed within the first vacuum enclosure 14. The first thermal shield 56 is disposed between, and spaced apart from, the first cryogenic vessel 52 and the first vacuum enclosure 14. The inner support cylinder 58 is generally coaxially aligned with the first axis 18, has a first end secured to the first vacuum enclosure 14, and has a second end secured to the first thermal shield 56. The outer support cylinder 60 is generally coaxially aligned with the first axis 18, has a first end secured to the first thermal shield 56, and has a second end secured to the first cryogenic vessel 52. In an exemplary construction, the first thermal shield 56 consists essentially of aluminum, and the inner and outer support cylinders 58 and 60 consist essentially of a fiber-reinforced composite. Preferably, the above-described securing of the ends of the nonmetallic support cylinders is accomplished by forming a rounded rim in the ends of the support cylinders and by using metal rings to capture the rims, some of such rings being attached to the metallic vacuum enclosure, the metallic thermal shield, or the metallic cryogenic vessel, as appropriate and as can be appreciated by the artisan. It is noted that the inner and outer support cylinders 58 and 60 are under tension and provide a superior system for mechanically supporting the magnet components within the first vacuum enclosure 14 against the magnetic forces generated by the magnet 10, as can be understood by those skilled in the art.

In a second cooling option, illustrated in the second assembly 28, the magnet 10 also includes a cryocooler coldhead 62 having a housing 64 attached to the second vacuum enclosure 30 and having a cold stage 66 which is in solid thermal conduction contact with the second superconductive shielding coil 38 and which is, by an interconnecting thermal busbar (not shown in the figures), in thermal conduction contact with the second superconductive main coil 36.

Figure 4:
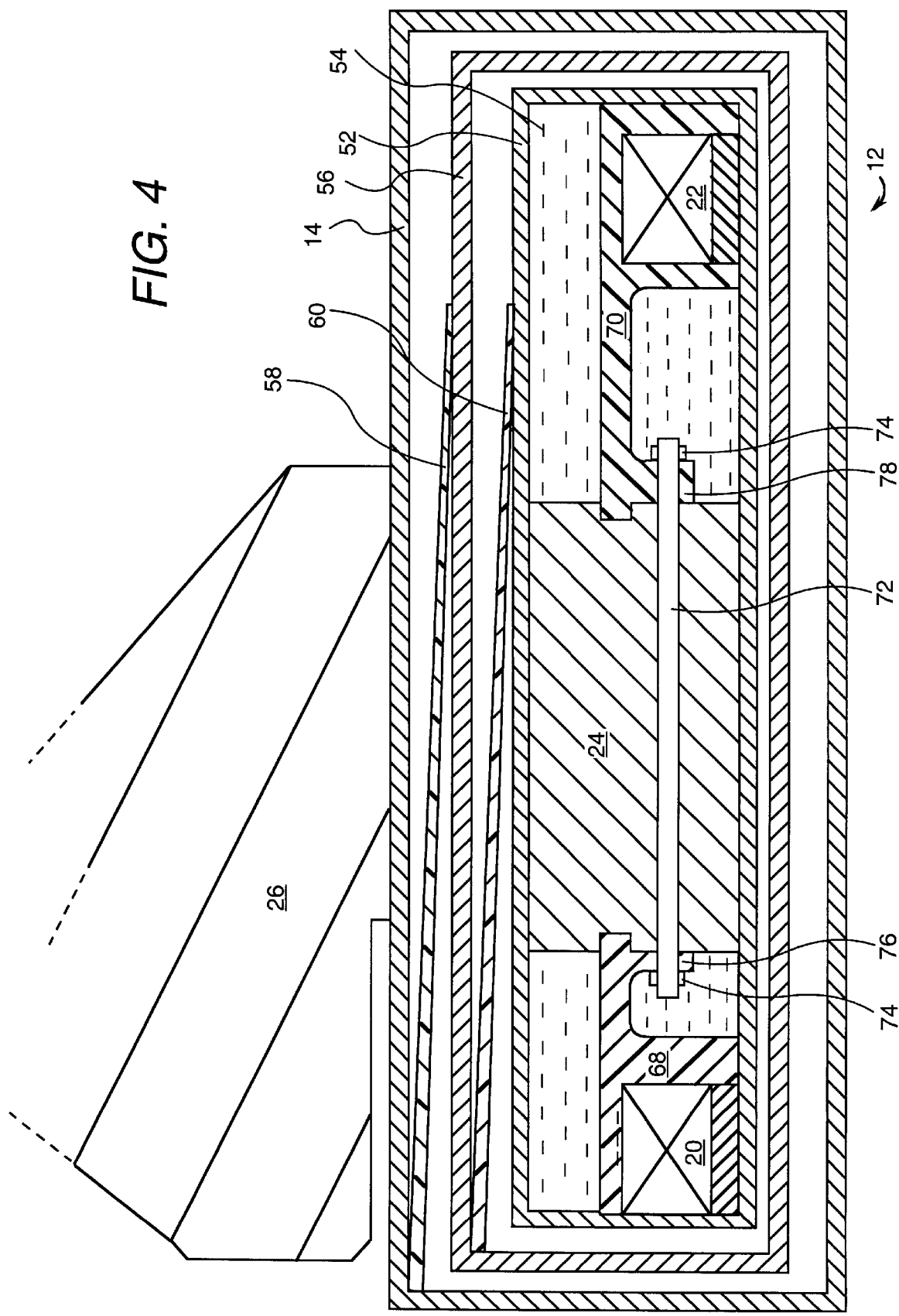
FIG. 4 is a detailed schematic view of a lower-right portion of the magnet shown in FIG. 3.

Other cooling options (not shown in the figures) include each assembly having its own cryogenic vessel, wherein the liquid cryogen in one cryogenic vessel is in fluid communication with the liquid cryogen in the other cryogenic vessel through an interconnecting thermally-insulated conduit disposed either within the support member or alongside the support member. Alternately, a solid thermal conduction path can be placed in the support member allowing the cryocooler coldhead on the second vacuum enclosure to also cool the superconductive main and shielding coil in the first vacuum enclosure. Typically one (as shown in FIG. 4) or more thermal shields are spaced apart from, and surround, the superconductive main and shielding coils. For cryogenic-cooling, such thermal shields (as shown in FIG. 4) are located outside the cryogenic vessel. To thermally interconnect the two assemblies, the vacuum enclosures, the thermal shields, and (if present) the cryogenic vessels of each assembly are interconnected, preferably in the vicinity of the support member. It is noted that, with any cooling option, the magnet 10 moreover includes, as needed, thermal spacers and coil forms, as is known to the artisan, for proper spacing and support of the magnet components, such spacers being omitted from the figures for clarity, and such coil forms to be hereinafter discussed.

In a preferred construction, the first assembly 12 includes a main coil form 68, a shielding coil form 70, a plurality of spaced-apart bolts 72 (only one of which is shown in the figures), and a multiplicity of internally-threaded nuts 74 (only two of which are shown in the figures). The main coil form 68 is disposed within the first vacuum enclosure 14, supports the first superconductive main coil 20, and has a main flange 76 abutting the first ring 24. The shielding coil form 70 is disposed within the first vacuum enclosure 14, supports the first superconductive shielding coil 22, and has a shielding flange 78 abutting the first ring 24. The bolts 72 each are disposed within the first vacuum enclosure 14 and together are arrayed circumferentially about the first axis 18. The bolts 72 each are aligned generally parallel to the first axis 18, and the bolts 72 each pass completely through the main flange 76, the first ring 24, and the shielding flange 78. Each of the bolts 72 has an externally-threaded longitudinally-outer end extending longitudinally outward and beyond the shielding flange 76 and an externally-threaded longitudinally-inner end extending longitudinally inward and beyond the main flange 76. The nuts 74 are threadably engaged on the longitudinally-inner and longitudinally-outer ends of the bolts 72. It is noted that the first and second rings 24 and 40 do not contain any threads because, being preferably made of carbon steel, they are brittle at cryogenic temperatures. Preferably, the main and shielding coil forms 68 and 70 consist essentially of fiberglass. Fiberglass insulation may be placed between a superconductive coil and a cryogenic vessel, and an aluminum overband (with intervening fiberglass insulation) may surround a superconductive coil, if desired for thermal and stress reasons, and as can be appreciated by those skilled in the art.

In an exemplary design, the first ring 24 is disposed longitudinally between the first superconductive main and shielding coils 20 and 22, and the second ring 40 is disposed longitudinally between the second superconductive main and shielding coils 36 and 38. Also, the first superconductive main coil 20 is disposed longitudinally closer to the first ring 24 than is the first superconductive shielding coil 22, and the second superconductive main coil 36 is disposed longitudinally closer to the second ring 40 than is the second superconductive shielding coil 38. Moreover, a longitudinal projection of the first ring 24 onto the previously-defined plane 46 completely covers a longitudinal projection of the first superconductive main coil 20 onto the previously-defined plane 46 and completely covers a longitudinal projection of the first superconductive shielding coil 22 onto the previously-defined plane 46. Likewise, a longitudinal projection of the second ring 40 onto the previously-defined plane 46 completely covers a longitudinal projection of the second superconductive main coil 36 onto the previously-defined plane 46 and completely covers a longitudinal projection of the second superconductive shielding coil 38 onto the previously-defined plane 46. Additionally, a longitudinal projection of the first superconductive shielding coil 22 onto the previously-defined plane 46 covers at least half of a longitudinal projection of the first superconductive main coil 20 onto the previously-defined plane 46, and a longitudinal projection of the second superconductive shielding coil 38 onto the previously-defined plane 46 covers at least half of a longitudinal projection of the second superconductive main coil 36 onto the previously-defined plane 46. Preferably, the first superconductive main and shielding coils 20 and 22 are the only superconductive coils disposed within the first vacuum enclosure 14, and the second superconductive main and shielding coils 36 and 38 are the only superconductive coils disposed within the second vacuum enclosure 30.

Figure 3:
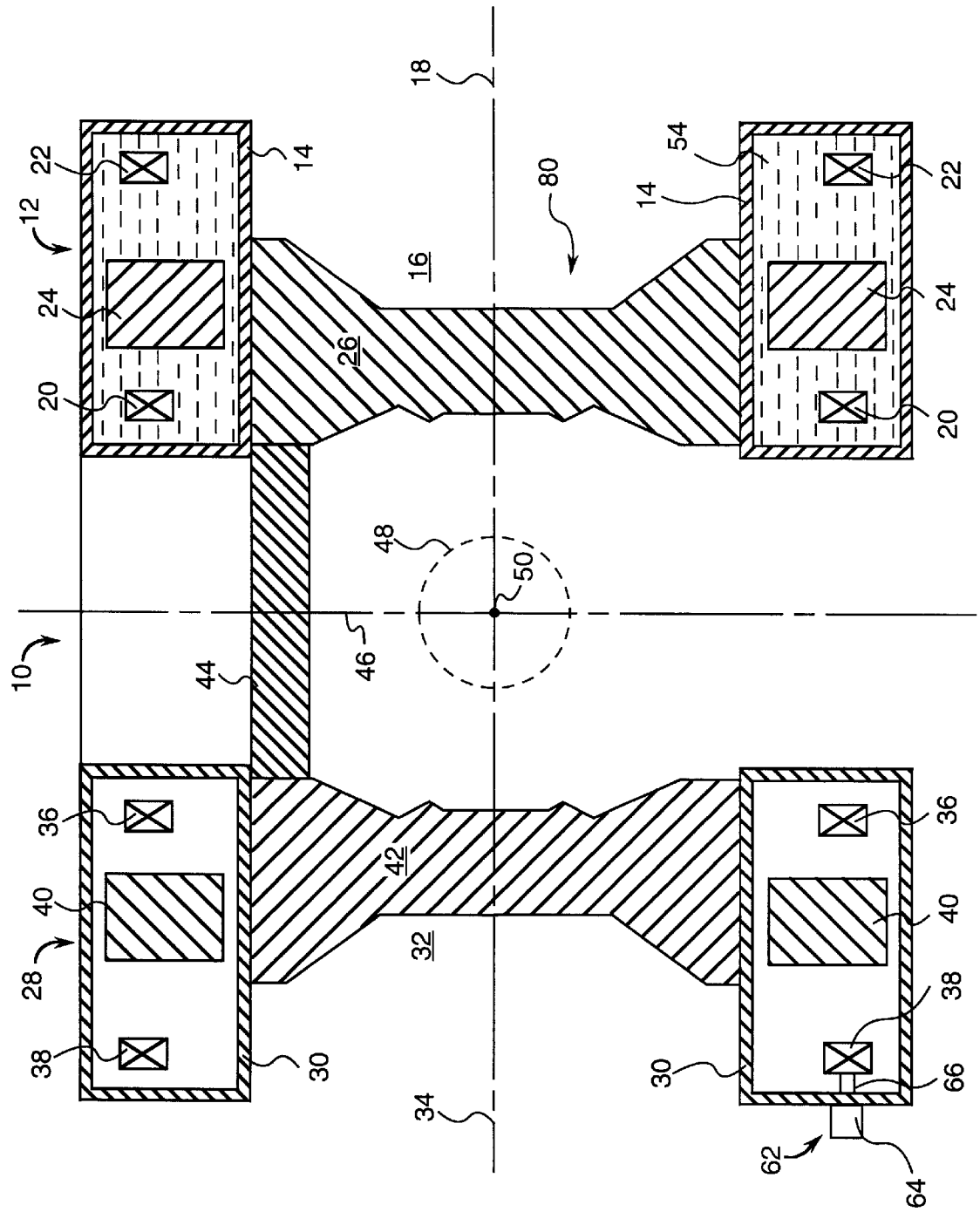
FIG. 3 is a cross sectional view of the magnet of FIGS. 1 and 2 taken along lines 3—3 of FIG. 2 with the addition of a cryocooler coldhead.

It is noted that those skilled in the art, using computer simulations based on conventional magnetic field analysis techniques, and using the teachings of the present invention, can design an open magnet with a desired magnetic field strength, a desired level of magnetic field inhomogenity, and a desired level of shielding (i.e., a desired position of the 5 Gauss stray magnetic field from the center of the imaging volume of the open superconductive magnet). It is noted, as shown in FIG. 3, that such analysis shows that a coaxially-aligned disk of iron can be removed from the longitudinally-outer area 80 of the first pole piece 26 without affecting the performance of the magnet 10, as can be appreciated by those skilled in the art. As previously mentioned, the pole piece and the ring enhance the strength of the magnetic field so less superconductor is needed in the main coil. The carbon steel ring provides a partial magnetic flux return for the main coil which reduces the iron needed in the pole piece and which reduces the amount of superconductor needed in the main coil. The carbon steel ring also magnetically decouples the shielding coil from the main coil so that the magnetic flux lines from the shielding coil are captured by the carbon steel ring and do not reach the magnetic flux lines from the main coil. Thus the iron mass of the pole piece does not have to be increased, and the amount of the superconductor in the main coil does not have to be increased, to offset the field subtracting effects of the magnetic flux lines from the shielding coil, since they are blocked by the presence of the carbon steel ring. Computer simulations show that a 0.7 Tesla magnet of the present invention, with the 5 Gauss stray magnetic field contained vertically within 3.8 meters, and horizontally within 4.8 meters, from the center 50 of the imaging volume 48 of the magnet 10, would use generally 800 pounds of superconductor yielding a magnet weighing generally 16,000 pounds (which is light enough to be installed in a medical facility) and costing only half of what a viable equivalent conventional magnet would cost.

The foregoing description of several preferred embodiments of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

What is claimed is:

1. An open superconductive magnet comprising:
 a) a first assembly including:
  (1) a generally toroidal-shaped first vacuum enclosure surrounding a first bore and having a generally longitudinally-extending first axis;

(2) a generally annular-shaped first superconductive main coil generally coaxially aligned with said first axis, disposed within said first vacuum enclosure, and carrying a first main electric current in a first direction;

(3) a generally annular-shaped first superconductive shielding coil generally coaxially aligned with said first axis, disposed within said first vacuum enclosure longitudinally outward from said first superconductive main coil, and carrying a first shielding electric current in a direction opposite to said first direction;

(4) a magnetizable and generally annular-shaped first ring generally coaxially aligned with said first axis, disposed within said first vacuum enclosure, and spaced apart from said first superconductive main and shielding coils; and (5) a magnetizable and generally cylindrical-shaped first pole piece generally coaxially aligned with said first axis and disposed inside said first bore and outside said first vacuum enclosure; and b) a second assembly including:
(1) a generally toroidal-shaped second vacuum enclosure surrounding a second bore, having a generally longitudinally-extending second axis generally coaxially aligned with said first axis, and longitudinally spaced apart from said first vacuum enclosure;

(2) a generally annular-shaped second superconductive main coil generally coaxially aligned with said second axis, disposed within said second vacuum enclosure, and carrying a second main electric current in said first direction;

(3) a generally annular-shaped second superconductive shielding coil generally coaxially aligned with said second axis, disposed within said second vacuum enclosure longitudinally outward from said second superconductive main coil, and carrying a second shielding electric current in said opposite direction, and wherein said first and second superconductive main coils are longitudinally closer to each other than are said first and second superconductive shielding coils;

(4) a magnetizable and generally annular-shaped second ring generally coaxially aligned with said second axis, disposed within said second vacuum enclosure, and spaced apart from said second superconductive main and shielding coils; and (5) a magnetizable and generally cylindrical-shaped second pole piece generally coaxially aligned with said second axis, disposed inside said second bore and outside said second vacuum enclosure, and longitudinally spaced apart from, and without a magnetizable solid path to, said first pole piece.

2. The magnet of claim 1, wherein said first pole piece is attached to said first vacuum enclosure, wherein said second pole piece is attached to said second vacuum enclosure, wherein said magnet also includes only one support member connecting said first and second pole pieces, wherein said support member is a nonmagnetizable support member disposed longitudinally completely between said first and second pole pieces, and wherein said support member and said first and second assemblies together have a generally "C" shape when viewed in a cross section of the magnet created by a cutting plane, wherein said first axis lies completely in said cutting plane, and wherein said cutting plane generally bisects said support member.

3. The magnet of claim 1, wherein said second assembly is a general mirror image of said first assembly about a plane disposed longitudinally equidistant between said first and second assemblies and oriented generally perpendicular to said first axis.

4. The magnet of claim 3, wherein said magnet also includes a magnetic resonance imaging volume disposed generally longitudinally equidistant between said first and second assemblies.

5. The magnet of claim 4, wherein said imaging volume is a generally spherical imaging volume having a center lying generally on said first axis.

6. The magnet of claim 3, wherein said first superconductive main and shielding coils are the only superconductive coils disposed within said first vacuum enclosure.

7. The magnet of claim 3, wherein said first ring is disposed longitudinally between said first superconductive main and shielding coils.

8. The magnet of claim 7, wherein said first superconductive main coil is disposed longitudinally closer to said first ring than is said first superconductive shielding coil.

9. The magnet of claim 7, wherein a longitudinal projection of said first ring onto said plane completely covers a longitudinal projection of said first superconductive main coil onto said plane and completely covers a longitudinal projection of said first superconductive shielding coil onto said plane.

10. The magnet of claim 7, wherein a longitudinal projection of said first superconductive shielding coil onto said plane covers at least half of a longitudinal projection of said first superconductive main coil onto said plane.

11. The magnet of claim 3, wherein said first assembly also includes:
a main coil form disposed within said first vacuum enclosure, supporting said first superconductive main coil, and having a main flange abutting said first ring;
a shielding coil form disposed within said first vacuum enclosure, supporting said first superconductive shielding coil, and having a shielding flange abutting said first ring; and
a plurality of spaced-apart bolts each disposed within said first vacuum enclosure, together arrayed circumferentially about said first axis, each aligned generally parallel to said first axis, and each passing completely through said main flange, said first ring, and said shielding flange.

12. The magnet of claim 11,
wherein said bolts each have an externally-threaded longitudinally-outer end extending longitudinally outward and beyond said shielding flange;
wherein said bolts each have an externally-threaded longitudinally-inner end extending longitudinally inward and beyond said main flange; and
wherein said first assembly further includes a multiplicity of internally-threaded nuts threadably engaged on said longitudinally-inner and longitudinally-outer ends of said bolts.

13. The magnet of claim 3, wherein said first pole piece consists essentially of iron, and wherein said first ring consists essentially of carbon steel.

14. The magnet of claim 3, wherein said magnet also includes a first cryogenic vessel disposed within said first vacuum enclosure and surrounding said first superconductive main and shielding coils and said first ring, and wherein said first cryogenic vessel contains a liquid cryogen.

15. The magnet of claim 14,
wherein said first assembly also includes a first thermal shield, an inner support cylinder, and an outer support cylinder all disposed within said first vacuum enclosure;

wherein said first thermal shield is disposed between, and spaced apart from, said first cryogenic vessel and said first vacuum enclosure;

wherein said inner support cylinder is generally coaxially aligned with said first axis, has a first end secured to said first vacuum enclosure, and has a second end secured to said first thermal shield; and wherein said outer support cylinder is generally coaxially aligned with said first axis, has a first end secured to said first thermal shield, and has a second end secured to said first cryogenic vessel.

16. The magnet of claim 15, wherein said inner and outer support cylinders each consist essentially of a fiber-reinforced composite, and wherein said liquid cryogen consists essentially of liquid helium.

17. The magnet of claim 3, wherein said magnet also includes a cryocooler coldhead having a cold stage, and wherein said cold stage is in solid thermal conduction contact with said second superconductive shielding coil.

* * * * *